United States Patent

Brady et al.

[11] Patent Number: 5,963,485
[45] Date of Patent: Oct. 5, 1999

[54] METHOD AND APPARATUS FOR BIT LINE RECOVERY IN DYNAMIC RANDOM ACCESS MEMORY

[75] Inventors: James Brady, Plano; James L. Worley, Flower Mound, both of Tex.

[73] Assignee: STMicroelectronics, Inc., Carrollton, Tex.

[21] Appl. No.: 09/136,695

[22] Filed: Aug. 19, 1998

[51] Int. Cl.$^6$ ........................................ G11C 7/00
[52] U.S. Cl. ................ 365/189.11; 365/196; 365/185.21
[58] Field of Search ........................ 365/185.21, 230.05, 365/189.11, 196, 205, 226, 185.25, 185.07, 190

[56] References Cited

U.S. PATENT DOCUMENTS

| | | | |
|---|---|---|---|
| 4,780,850 | 10/1988 | Miyamoto et al. | 365/189 |
| 4,980,860 | 12/1990 | Houston et al. | 365/189.11 |
| 5,138,581 | 8/1992 | Miyamoto et al. | 365/230.05 |
| 5,438,543 | 8/1995 | Yoon | 365/189.11 |
| 5,646,899 | 7/1997 | Jang et al. | 365/205 |

*Primary Examiner*—David Nelms
*Assistant Examiner*—Thong Le
*Attorney, Agent, or Firm*—Theodore E. Galanthay; Lisa K. Jorgenson; Andre M. Szuwalski

[57] ABSTRACT

A bit line recovery circuit for random access memory. The circuit includes a pair of pull-up devices, each of which is connected to a bit line of a bit line pair. Pass gates are disposed between a sense amplifier and the bit lines. The pull-up devices are cross-coupled such that the gate node of the pull-up devices are connected to the sense amplifier on the opposed side of the pass gates in order to rapidly turn on the appropriate pull-up device following a memory cell read operation.

13 Claims, 3 Drawing Sheets

METHOD AND APPARATUS FOR BIT LINE RECOVERY IN DYNAMIC RANDOM ACCESS MEMORY

BACKGROUND OF THE INVENTION

1. Technical Field of the Invention

The present invention relates to a device and method for recovering data accessed from random access memory cells, and particularly to a device and method for recovering bit line data from a dynamic random access memory (DRAM) cell.

2. Background of the Invention

Conventional DRAM cells employ a single transistor architecture wherein the memory cell comprises a storage capacitor having a first terminal connected to a reference voltage, such as Vss, and a second terminal connected to a pass and/or transmission gate transistor. The gate electrode of the pass/transmission gate transistor is tied to a word line decode signal and the drain electrode thereof is connected to a bit line. When a DRAM cell is read, the stored charge is shared between the capacitance of the storage capacitor and the capacitance of the corresponding bit line. The change in charge appearing on the bit lines following a memory cell read operation is small because the capacitance of the bit lines is significantly larger than the capacitance of the individual storage capacitors and because charge stored in a memory cell decays over time. Consequently, sense amplifiers are utilized to recover the full reference voltage level signal corresponding to the stored data.

The core of a DRAM is typically partitioned into arrays or blocks of memory cells, with each array including a plurality of rows of memory cells and with the cells in each row being connected to a respective one of a plurality of word lines. Memory cells in each column of cells in an array are connected to a respective one of a plurality of bit lines. Bit lines are grouped in pairs such that when data from a memory cell is read onto a first bit line of a bit line pair, the second bit line of the bit line pair is provided with a voltage level that is representative of a signal between a low logic level and a high logic level, relative to the amount of charge that can be placed thereon by a charged stored in a memory cell. This difference in voltage levels between the bit lines of the bit line pair is the differential to which an associated sense amplifier operatively responds.

The sense amplifier is connected to the bit lines to sense the small change in potential appearing on the bit lines following a memory cell read operation and to drive the bit lines to the appropriate full reference voltage level, such as Vdd or Vss. Once the sense amplifier drives the bit line to the full reference voltage level, the memory cell from which data was read is refreshed with the full reference voltage signal appearing on the bit line.

Sense amplifiers are operatively connected to a pair of bit lines from one or more memory arrays. Pass and/or transmission gates are employed between the sense amplifiers and the pairs of bit lines from adjacent memory arrays connected to the sense amplifier, in part to limit the capacitance appearing on the bit lines when the sense amplifiers are active, thereby decreasing the time necessary to perform a memory cell read and associated refresh operation. The pass/transmission gates additionally allow the bit lines of the selected bit line pair to incur a slight delay relative to the sense amplifier output nodes as the output nodes are being driven to full reference voltage levels, thereby increasing the speed at which the sense amplifier senses the charge differential of the bit line pair and drives its output nodes. However, because the pass gates usually comprise n-channel transistors, a sense amplifier is unable to drive its corresponding bit line to a full Vdd potential. Because a sense amplifier cannot store a full Vdd signal, representing a high logic level, into a memory cell and because a stored charge in a memory cell decays over time, a memory cell storing a high logic level is capable of maintaining the data only for a very limited period of time.

Attempts to overcome the aforementioned problem include employing CMOS pass gates in place of the n-channel pass gates. However, such implementations do not facilitate driving the bit lines by the sense amplifiers in a rapid manner. There remains a need for effectively driving DRAM bit lines and memory cells to full reference voltage levels quickly and accurately.

SUMMARY OF THE INVENTION

The present invention overcomes the shortcomings of prior bit line recovery devices and satisfies a significant need for bit line recovery in a DRAM -operating at higher speeds. The charge differential appearing on the corresponding bit line pair from reading data from a memory cell is sensed, and the bit line pair is driven to full Vdd/Vss reference voltage levels, thereby recovering the logic level signal of the data stored in the memory cell.

The present bit line recovery circuit includes a pair of transistors. A first transistor of the transistor pair has a drain node that is connected to a first bit line of a bit line pair. A second transistor of the transistor pair has a drain node that is connected to the second bit line of the bit line pair. The gate nodes of the transistor pair are cross-coupled such that the gate node of the first transistor is responsive to a sense amplifier driving the second bit line of the bit line pair and the gate node of the second transistor is responsive to the sense amplifier driving the first bit line of the bit line pair. The source node of each of the two transistors is connected to a recovery control line that is selectively driven to the high reference voltage level. In this way, when the sense amplifier drives the bit line pair towards opposed reference voltage levels, such as Vdd and Vss, the one transistor of the transistor pair having its drain tied to the bit line being driven by the sense amplifier towards the high reference voltage level is turned on. The transistor of the transistor pair that is turned on pulls its corresponding bit line to the full high reference voltage level (Vdd) for subsequent writing to the memory cell from which data was previously read. The other transistor of the transistor pair is not turned on and thus does not pull-up the bit line that is driven to the low reference voltage level (Vss) by the sense amplifier.

In a first embodiment of the present invention, the gate nodes of the first and second transistors are directly connected to the bit lines of the bit line pair. In a second embodiment of the present invention, the gate nodes of the first and second transistors are directly connected to the sense amplifier on the side of the pass gates opposite the bit lines and their corresponding memory cells, so that the one transistor of the transistor pair being turned on when the sense amplifier drives the bit lines is more quickly pulled to the high reference voltage level.

BRIEF DESCRIPTION OF THE DRAWINGS

A more complete understanding of the present invention may be had by reference to the following detailed description when taken in conjunction with the accompanying drawings wherein.

DETAILED DESCRIPTION OF THE PREFERRED EMBODIMENTS

Figure 1:
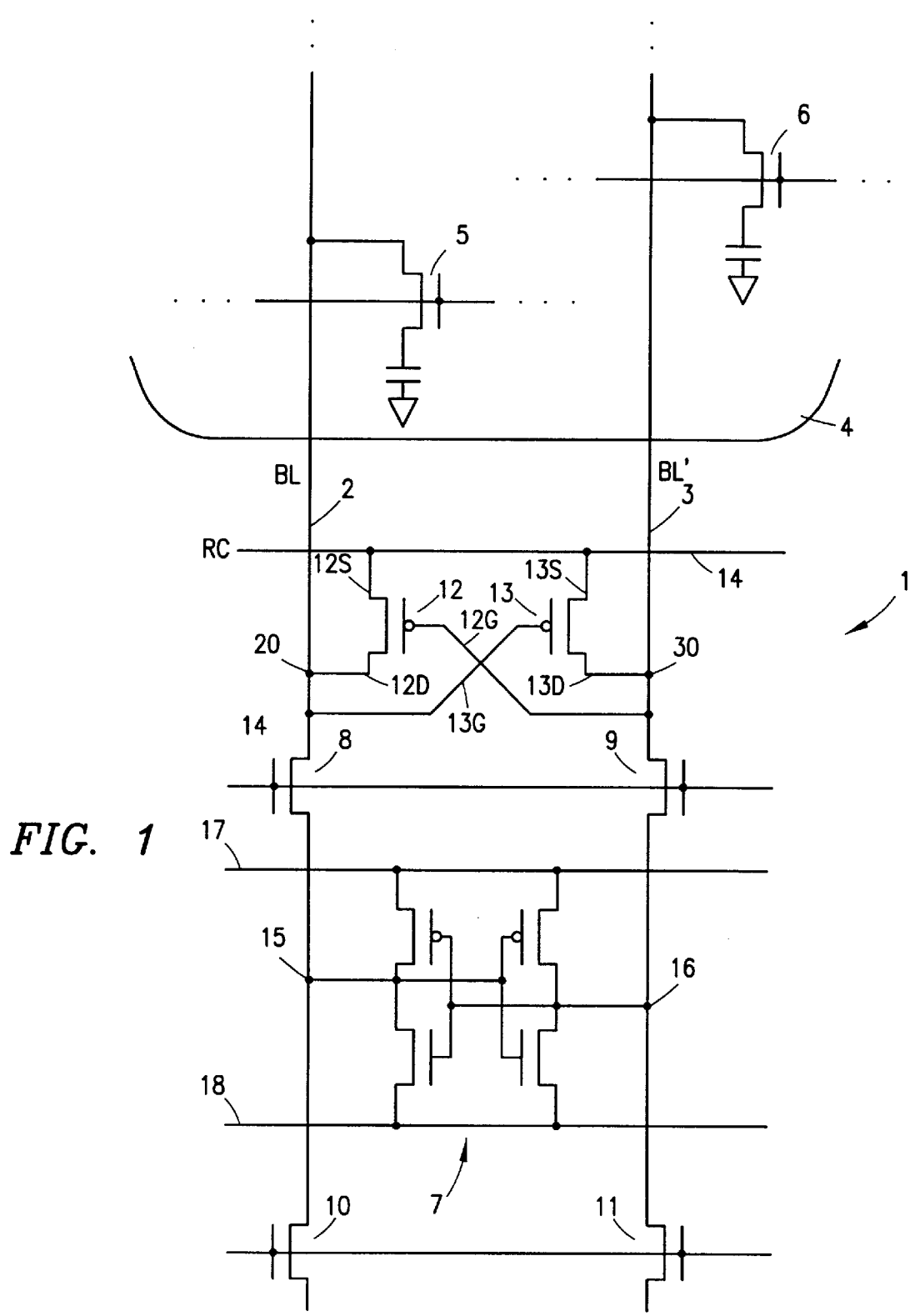
FIG. 1 is a diagram of DRAM bit line recovery circuitry according to a first preferred embodiment of the present invention.

Referring to FIG. 1, there is shown a bit line recovery circuit 1 for a random access memory device, such as a DRAM. The recovery circuit of the present invention is described hereinbelow in conjunction with a single bit line pair for exemplary purposes only. It is understood that the bit line recovery device of the present invention is preferably associated with each bit line pair in a memory device.

The present invention can be applied to any appropriate memory structure wherein each column comprises a plurality of memory cells connected to a single bit line, and is not restricted to any specific structure of memory cell. The present invention is applicable for stand-alone memory chips but is especially suited memory embedded within an integrated circuit, such as a microprocessor chip or an application specific integrated circuit (ASIC) wherein typically more metal layers may better accommodate the efficient routing between transistor elements.

A pair of bit lines BL 2 and BL' 3 receives a charge differential representing a data value, such as a logic level low or logic level high, which was stored in and subsequently read from a DRAM cell connected thereto. Bit line pair BL 2 and BL' 3 is suitably associated with two columns of memory cells of a first memory array 4. FIG. 1 illustrates two DRAM storage cells 5 and 6 from first memory array 4 connected to bit line pair BL 2 and BL' 3, respectively. It is understood that a number of DRAM cells of first memory array 4 are connected to each bit line BL 2 and BL' 3. When connected to a sense amplifier 7, the bit lines BL 2 and BL' 3 are selectively driven towards two opposite reference voltage values, such as Vdd and Vss. Pass and/or transmission gates 8 and 9 are connected between bit line pair BL 2 and BL' 3 and sense amplifier 7, respectively, to facilitate the sensing and driving operation of sense amplifier 7. Pass/transmission gates 8 and 9 are activated on or around the time data is provided to one of bit lines BL 2 and BL' 3 due to a memory cell read operation, and remain activated until the accessed memory cell is refreshed. Additional pass/transmission gates 10 and 11 are connected between sense amplifier 7 and another bit line pair associated with a second memory array (not shown).

Bit line recovery circuit 1 preferably includes a first p-channel field effect transistor 12 and a second p-channel field effect transistor 13. The transistor pair comprising first transistor 12 and second transistor 13 is preferably suitably connected to bit line pair BL 2 and BL' 3 so as to pull the appropriate one of the bit lines BL 2 and BL' 3 to the high reference voltage level. The transistor pair of first transistor 12 and second transistor 13 is selectively activated and responsive to sense amplifier 7 detecting a charge differential appearing on bit line pair BL 2 and BL' 3 and driving its output nodes 15 and 16 towards the reference voltage levels.

The drain 12D of first transistor 12 is preferably connected to bit line BL 2 whereas the drain 13D of second transistor 13 is connected to bit line BL' 3. The source node 12S of first transistor 12 and the source node 13S of second transistor 13 are connected to recovery control line 14, which is selectively connected to the high voltage reference level (not shown). The gate electrodes of first transistor 12 and second transistor 13 are cross-coupled with respect to bit lines BL 2 and BL' 3 so that as sense amplifier 7 drives bit line pair BL 2 and BL' 3 towards opposite reference voltage levels, one of either first transistor 12 or second transistor 13 whose gate is tied to the bit line being driven to the lower reference voltage level (Vss) is turned on, while the other transistor of the transistor pair remains turned off. With recovery control line 14 pulled to the high reference voltage level (Vdd), the one transistor of the transistor pair which is turned on thereupon operates as a pull-up transistor to pull the bit line connected to its drain to the high reference voltage level.

In a first preferred embodiment of the present invention, the transistor pair comprising first transistor 12 and second transistor 13 is cross coupled to bit lines BL 2 and BL' 3, so that gate node 12G of first transistor 12 is connected to bit line BL' 3 at node 30 and gate node 13G of second transistor 13 is connected to bit line BL 2 at node 20. In this way, when sense amplifier 7 drives bit lines BL 2 and BL' 3 towards opposite reference voltage levels, either one of first transistor 12 or second transistor 13 whose gate node is connected to the bit line being driven to the low reference voltage level, such as Vss, is turned on. The result is that the bit line being driven towards the high reference voltage level by sense amplifier 7 is pulled to the full reference voltage level due to the turned on transistor of first transistor 12 and second transistor 13.

Figure 2:
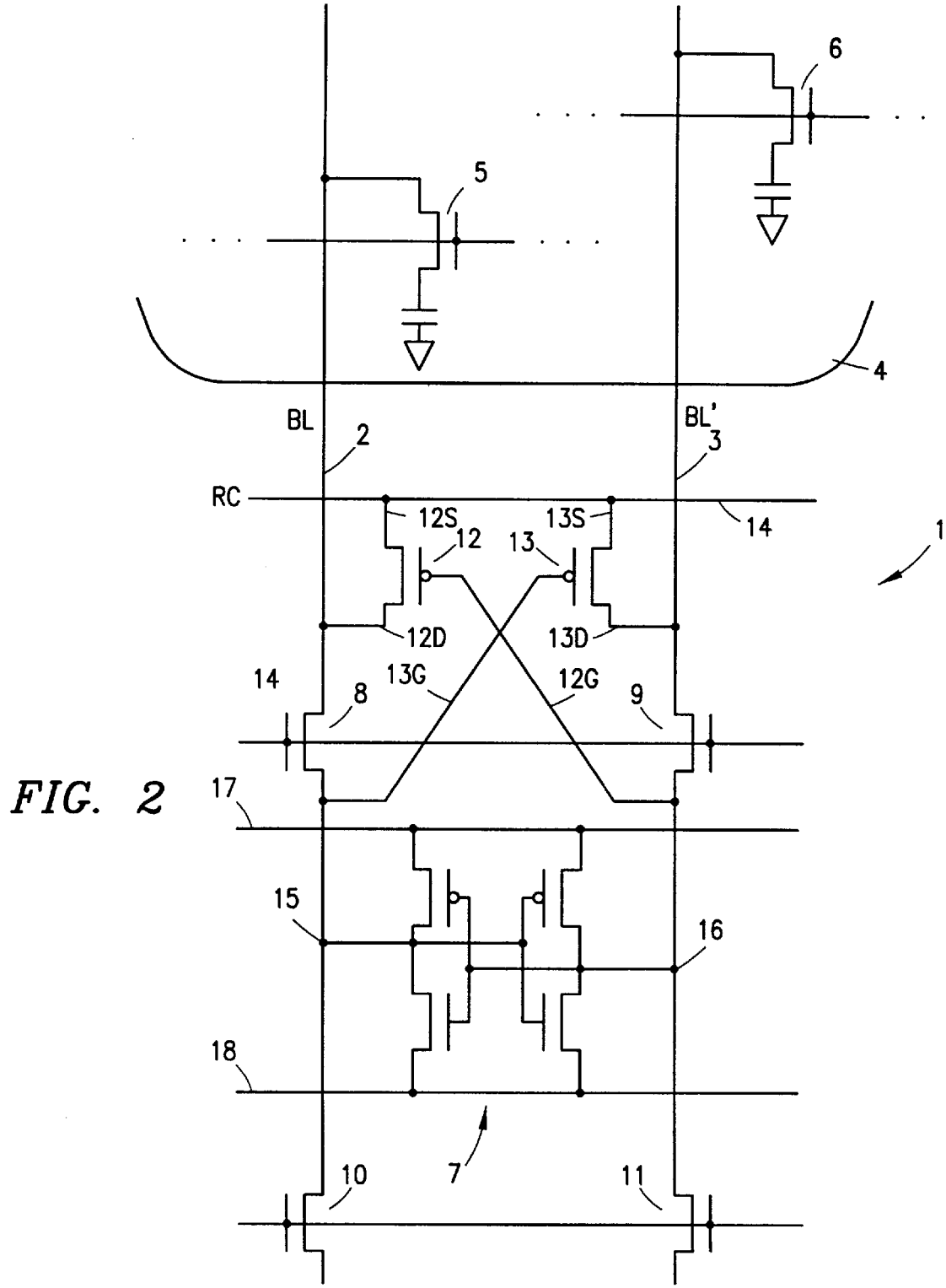
FIG. 2 is a diagram of DRAM bit line recovery circuitry according to a second preferred embodiment of the present invention.

FIG. 2 illustrates a second preferred embodiment of the present invention. The components and operation of the second preferred embodiment closely follow the components and operation of the first embodiment, except as explained below. For reasons of clarity, the elements in the second preferred embodiment utilize the same reference numbers utilized in the first preferred embodiment as shown in FIG. 1.

Gate node 12G of first transistor 12 and gate node 13G of second transistor 13 are cross-coupled directly to sense amplifier output nodes 16 and 15, respectively. Connecting gate nodes of the transistor pair of first transistor 12 and second transistor 13 directly to the outputs of sense amplifier 7 results in the one transistor of the transistor pair of first transistor 12 and second transistor 13 that is to be turned on turning on slightly faster than if the gate nodes were directly connected to bit lines BL 2 and BL' 3 (FIG. 1). Because pass gates 8 and 9 possess a finite, non-zero "on" resistance, there exists a delay between the signal at nodes 15 and 16 of sense amplifier 7 and bit lines BL 2 and BL' 3, respectively, as nodes 15 and 16 are driven towards the reference voltage levels by sense amplifier 7. The second embodiment of the present invention thus allows the transistor pair of first transistor 12 and second transistor 13 to respond more quickly to pull one of the bit lines BL 2 and BL' 3 to the high reference voltage level than if gate nodes 12G and 13G were tied to bit lines BL' 3 and BL 2, respectively. The second embodiment of the present invention therefore provides an additional advantage over the first embodiment of the present invention.

Figure 3:
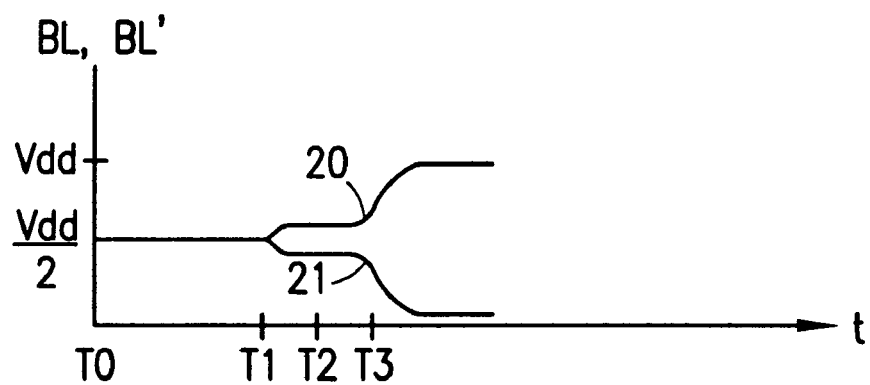
FIG. 3 is a timing diagram showing a read operation according to a preferred embodiment of the present invention.
Figure 3:
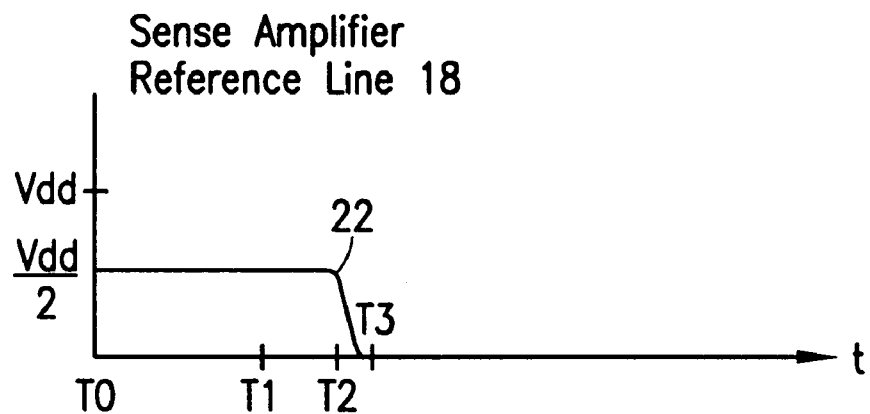
Figure 3:
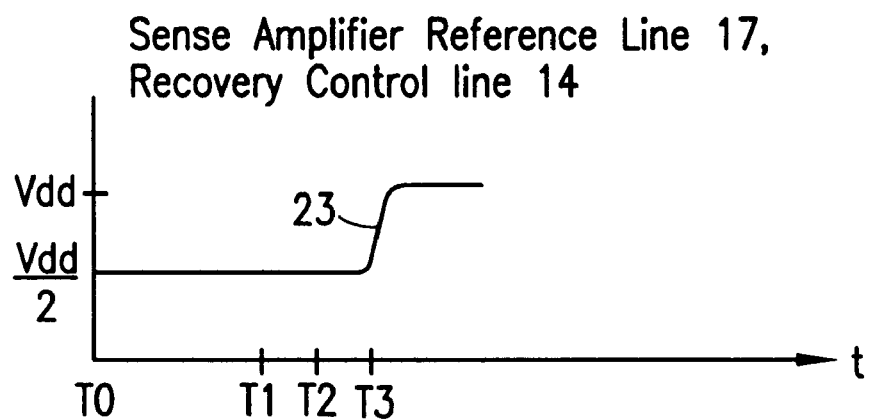

The operation of the present invention may be best described by way of an illustration with respect to the second preferred embodiment thereof. Prior to stored data being read from a memory cell, bit lines BL 2 and BL' 3, sense amplifier nodes 15 and 16, sense amplifier reference lines 17 and 18 and recovery control line 14 are connected to an intermediate voltage level between the high reference voltage level (Vdd) and the low reference voltage level (Vss), such as Vdd/2, as shown at time T0 in FIG. 3. In this state, first transistor 12 and second transistor 13 are turned off. Consider the situation in which stored data is read from a memory cell so that the voltage appearing on bit line BL 2 is slightly above Vdd/2 and the voltage appearing on bit line BL' 3 is slightly below Vdd/2 and/or the voltage appearing on bit line BL 2 at time T1. Waveform 20 of FIG. 3 represents the voltage level appearing on bit line BL 2 and waveform 21 represents the voltage appearing on bit line BL' 3. This situation may be due, for example, to stored data representing a high logic level being read from a memory cell onto bit line BL 2, and stored data representing an intermediate voltage between a high logic level and a low logic level being read onto bit line BL' 3 from a dummy memory cell (not shown). Next, sense amplifier reference line 18 is driven to the low reference voltage source at time T2 (FIG. 3). Sense amplifier reference line 17 and recovery control line 14, both represented by waveform 23 in FIG. 3, are each driven to the high reference voltage source at time T3, a period of time after sense amplifier reference line 18 is driven. This delay is because in some environments, such as an ASIC environment, the low reference source (Vss) powering the memory device is typically the reference for the memory device and as such is usually less noisy than the high reference voltage source (Vdd), so that sensing the charge differential is less affected by noise and less likely to be incorrectly sensed if sense amplifiers 7 are connected to the low reference voltage source before being connected to the high reference voltage source. It is noted that in some memory designs, such as a memory device which is not embedded in a relatively noisy integrated circuit chip, sense amplifier reference line 17 is driven to the high reference voltage level at the same time that sense amplifier reference line 18 is driven to the low reference voltage level.

Once powered, sense amplifier 7 detects the voltage differential between sense amplifier node 15 and sense amplifier node 16 and, due to the cross-coupled invertors of sense amplifier 7, begins to drive node 15 to the high reference voltage level (Vdd) and node 16 to the low reference voltage level (Vss). With pass gates 8 and 9 being turned on, bit lines BL 2 and BL' 3 follow the voltage levels of node 15 and 16, respectively.

At or around the time sense amplifier reference line 17 is driven to the high reference voltage level, recovery control line 14 is driven to the high reference voltage level (Vdd). With node 16 being driven towards the low reference voltage level (Vss) and bit line BL being driven towards the high reference voltage level (Vdd), first transistor 12 turns on, which causes first transistor 12 to quickly pull bit line BL 2 to the high reference voltage level, as shown in FIG. 3. Because the gate node of first transistor 12 is connected to node 16, first transistor 12 is turned on faster than if its gate node 12G was connected to bit line BL' 3, thereby providing a pull-up device to bit line BL 2 sooner so that bit line BL 2 is pulled to the high reference voltage level more quickly.

Alternatively, in the event stored data representing a logic level low is read onto bit line BL 2 or stored data representing a logic level high is read onto bit line BL' 3, the voltage appearing on bit line BL 2 following the read operation is slightly less than the voltage appearing on bit line BL' 3. Sense amplifier 7, when powered by first driving sense amplifier reference line 18 to the low reference voltage level followed by driving sense amplifier reference line 17 to the high reference voltage level, detects the voltage differential between nodes 15 and 16 and, due to the cross-coupled nature of sense amplifier 7, begins to drive node 15 to the low reference voltage level and node 16 to the high reference voltage level. Around the time sense amplifier reference line 17 is driven, recovery control line 14 is driven to the high reference voltage level (Vdd). With node 15 being driven towards the low reference voltage level, second transistor 13 turns on, which causes second transistor 13 to quickly pull bit line BL' 3 to the high reference voltage level, thereby providing a fast activating pull-up device to bit line BL' 3.

Although the preferred embodiment of the present invention has been illustrated in the accompanying drawings and described in the foregoing detailed description, it will be understood that the invention is not limited to the embodiments disclosed, but is capable of numerous rearrangements, modifications and substitutions without departing from the spirit of the invention as set forth and defined by the following claims.

What is claimed is:

1. A bit line recovery device for random access memory having at least one pair of bit lines, comprising:

a first pull-up device connected to a first bit line of the bit line pair;

a second pull-up device connected to a second bit line of the bit line pair;

sense amplifier circuitry, including pull-up and pull-down devices, for sensing a voltage differential appearing on the bit line pair and for driving the bit lines of the bit line pair towards different reference voltage levels; and coupling circuitry, connected between each bit line and the sense amplifier circuitry, for selectively passing signals driven by said sense amplifier circuitry to each bit line of the bit line pair from separate outputs thereof;

wherein a control element of said second pull-up device is electrically connected to a first output of the sense amplifier circuitry, and a control element of the first pull-up device is electrically connected to a second output of the sense amplifier circuitry.

2. The device of claim 1, wherein said first pull-up device and said second pull-up device are selectively connected to a first reference voltage source.

3. The device of claim 1, wherein:

said coupling circuitry comprises a first transmission gate connected between the first bit line and said sense amplifier circuitry at said first output thereof, and a second transmission gate connected between the second bit line and said sense amplifier circuitry at said second output thereof.

4. The device of claim 1, wherein:

said first pull-up device and said second pull-up device each comprises a field effect transistor.

5. The device of claim 4, wherein:

said field effect transistors are p-channel field effect transistors.

6. The device of claim 3, wherein:

the first transmission gate comprises a transistor having a first source/drain terminal connected to said first bit line and a second source/drain terminal connected to said first output of said sense amplifier circuitry.

7. The device of claim 3, wherein:

the second transmission gate comprises a transistor having a first source/drain terminal connected to said second bit line and a second source/drain terminal connected to said second output of said sense amplifier circuitry.

8. A bit line recovery device for a semiconductor memory device having at least one bit line pair and a sense amplifier including pull-up and pull-down circuitry for driving the bit lines of the bit line pair substantially to opposite reference voltage levels, said device comprising:

a first pull-up device connected to a first bit line of the bit line pair;

a second pull-up device connected to a second bit line of the bit line pair; and a first transmission gate connected between the first bit line and the sense amplifier at a first output thereof;

wherein a control node of said second pull-up device is connected to the first output of the sense amplifier.

9. The device of claim 8, further including:

a second transmission gate connected between the second bit line and the sense amplifier at a second output thereof;

wherein a control node of said first pull-up device is connected to said second output of said sense amplifier.

10. The device of claim 8, wherein said first pull-up device and said second pull-up device each comprises a field effect transistor.

11. The device of claim 10, wherein:

said field effect transistors are p-channel field effect transistors.

12. The device of claim 9, wherein:

said first pull-up device comprises a first transistor having a drain connected to the first bit line of the bit line pair and a source selectively connected to a first reference voltage source;

said second pull-up device comprises a second transistor having a drain connected to the second bit line of the bit line pair and a source selectively connected to said first reference voltage source;

a gate node of said first transistor is connected to the sense amplifier at the second output thereof; and a gate node of said second transistor is connected to the sense amplifier at the first output thereof.

13. A circuit for random access memory including at least one pair of bit lines, each bit line of the bit line pair being selectively connected to a plurality of storage cells, and a sense amplifier operatively associated with the bit line pair to sense a voltage differential appearing on the bit lines of the bit line pair and to drive the bit lines of the bit line pair towards opposed reference voltage levels, said circuit comprising:

a first transmission gate transistor including a first element connected to a first bit line of the bit line pair and a second element connected to the sense amplifier at a first output thereof;

a second transmission gate transistor including a first element connected to a second bit line of the bit line pair and a second element connected to the sense amplifier at a second output thereof;

a first field effect transistor including a drain node connected to the first bit line, a source node selectively connected to a high reference voltage source, and a gate node connected to the second output of the sense amplifier; and a second field effect transistor including a drain node connected to the second bit line, a source node selectively connected to the high reference voltage source, and a gate node connected to the first output of the sense amplifier.

* * * * *